US007202662B2

(12) United States Patent
Markl et al.

(10) Patent No.: US 7,202,662 B2
(45) Date of Patent: Apr. 10, 2007

(54) CORRECTION OF THE EFFECT OF GRADIENT FIELD NON-LINEARITIES IN PHASE CONTRAST MRI

(75) Inventors: Michael Markl, Palo Alto, CA (US); Norbert J. Pelc, Los Altos, CA (US); Roland Bammer, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 815 days.

(21) Appl. No.: 10/463,741

(22) Filed: Jun. 16, 2003

(65) Prior Publication Data

US 2004/0113616 A1 Jun. 17, 2004

Related U.S. Application Data

(63) Continuation-in-part of application No. 10/317,516, filed on Dec. 11, 2002, now Pat. No. 6,969,991.

(51) Int. Cl.
*G01V 3/00* (2006.01)
(52) U.S. Cl. .................... 324/306; 324/307
(58) Field of Classification Search ........... 324/306, 324/307, 309
See application file for complete search history.

(56) References Cited

U.S. PATENT DOCUMENTS

| 4,591,789 | A | 5/1986 | Glover et al. |
| 5,539,310 | A | 7/1996 | Basser et al. |
| 5,828,215 | A | * | 10/1998 | Boettcher ................. 324/306 |
| 6,163,152 | A | 12/2000 | Bernstein et al. |
| 6,445,182 | B1 | 9/2002 | Dean et al. |
| 6,463,315 | B1 | 10/2002 | Klingberg et al. |
| 6,788,062 | B2 | 9/2004 | Schweikard et al. |
| 6,957,097 | B2 * | 10/2005 | Park et al. ................. 600/419 |
| 6,969,991 | B2 * | 11/2005 | Bammer et al. ........... 324/307 |
| 7,145,334 | B2 * | 12/2006 | Assmann et al. .......... 324/306 |

OTHER PUBLICATIONS

Markl et al., "Generalized Reconstruction of Phase Contrast MRI: Analysis and Correction of the Effect of Gradient Field Distortions," 2003, *Magnetic Resonance in Medicine*, vol. 50, pp. 791-801.
Roméo et al., "Magnet Field Profiling: Analysis and Correcting Coil Design," 1984, *Magnetic Resonance in Medicine*, vol. 1, pp. 44-65.

* cited by examiner

*Primary Examiner*—Louis M. Arana
(74) *Attorney, Agent, or Firm*—Beyer Weaver LLP

(57) ABSTRACT

Errors in qualitative phase contrast measurements due to gradient field heterogeneities are reduced by using either a generalized reconstruction algorithm or an approximate reconstruction algorithm. True velocities are calculated using measured velocity information and phase differences, first moments of gradients, and gyromagnetic ratio.

6 Claims, 6 Drawing Sheets

C: y-Gradient-Coil

Correlation Measurement - Model

——— standard PC
----- generalized PC
—··—·· difference

CORRECTION OF THE EFFECT OF GRADIENT FIELD NON-LINEARITIES IN PHASE CONTRAST MRI

CROSS-REFERENCE TO RELATED APPLICATION

This patent application is a continuation in part of U.S. patent application Ser. No. 10/317,516 filed Dec. 11, 2002 now U.S. Pat. No. 6,969,991, for "Correction of the Effects of Spatial Gradient Field Distortions in Diffusion-Weighted Imaging," which is incorporated herein by reference for all purposes.

GOVERNMENT RIGHTS

The U.S. Government has rights in this invention pursuant to NIH Grant No. P41RRO9784 to Stanford University.

BACKGROUND

This invention relates generally to magnetic resonance imaging (MRI), and more particularly the invention relates to flow imaging using phase contrast MRI.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

Phase contrast MRI (PC-MRI) is widely used to assess blood flow and tissue motion. The technique relies on the measurement of changes in the signal phase due to flow or motion in the presence of known linear magnetic gradient fields.

Although it is well known that non-uniformity in magnetic field gradients can cause significant image warping and require correction, little has been reported about the impact of spatial gradient field distortions on velocity encoding.

In PC-MRI, these imperfections introduce errors in velocity measurements by affecting the first moments used to encode flow or motion. Typically, based on the deviations of the actual gradient from the desired, uniform gradient, the spatial image distortions in magnitude and phase images are retrospectively corrected by image unwarping algorithms, e.g., with algorithms included in the image reconstruction software. The velocity-encoded information is moved to its correct location but the error in velocity encoding due to the local field deviation still persists. Previous work (e.g., U.S. Pat. No. 6,163,152) recognized the impact of errors in the strength of the encoding gradient and disclosed a correction for this effect. In some recent high performance gradient systems, the coil size was reduced to limit dB/dt and amplifier power. As a result, gradient uniformity has become even more degraded.

SUMMARY OF THE INVENTION

The inventors recognized that error in not only the strength but also the direction of the local gradient from its ideal value is directly reflected in errors in the first order gradient moments and thus the velocity encoding. Therefore, gradient field distortions can lead to c not only deviations from the nominal gradient strength but also from the intended gradient direction and thus affects not only the magnitude of encoded velocities but also velocity encoding direction in PC MRI.

In accordance with the invention, a generalized method for the characterization of gradient field non-uniformity and accurate reconstructions of phase contrast data is presented. While acquisition of three-directional velocity information is required to apply this generalized reconstruction for typical applications of phase contrast MRI, the full three-directional velocity information may not be readily available or difficult to obtain for practical reasons (e.g., limited total acquisition time in breath-held measurements or desired high temporal resolution for a single velocity component such as through plane flow at the level of heart valves). Therefore, an additional approximate solution which does not require the full three-directional velocity information is provided for practical applications.

The invention and objects and features thereof will be more readily apparent from the following detailed description and appended claims when taken with the drawings.

DETAILED DESCRIPTION OF THE EMBODIMENTS

Figure 1A:
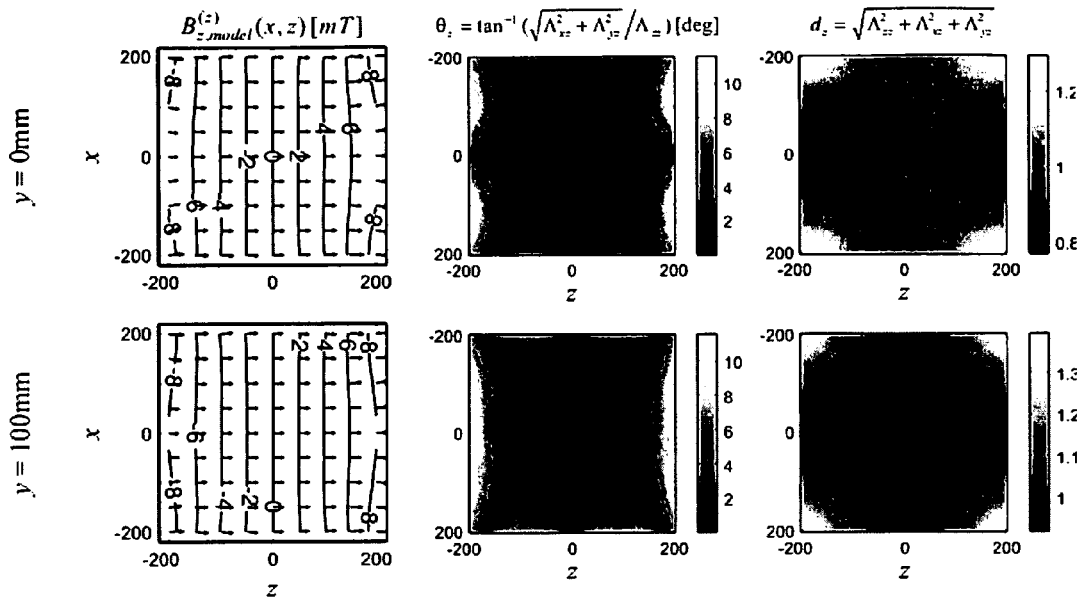
FIGS. 1A–1C are simulated iso-contours (labeled in units of mT) for the magnetic field $B_{z,model}^{(i)}$ (x, z) generated by the i-gradient coil (i=x,y,z, FIG. 1A: z-gradient coil, FIG. 1B: x-gradient coil, FIG. 1C: y-gradient coil) in coronal planes at y=0 mm and y=200 mm (left column) with the overlaid vector field representing the projection of the magnetic field gradient into the coronal plane.

As noted above, inhomogeneous, or heterogeneous, gradient fields can introduce deviations from the nominal gradient strength and orientation and therefore spatially dependent first gradient moments. Resulting errors in the measured phase shifts used for velocity encoding can therefore cause significant deviations in velocity quantification. In accordance with the invention, the true magnitude and direction of the underlying velocities can be recovered from the phase difference images by a generalized phase contrast velocity reconstruction which requires the measurement of full three-directional velocity information. The generalized reconstruction of velocities is applied using a matrix formalism that includes relative gradient field deviations derived from a mathematical model of local gradient field non-uniformity. In addition, an approximate solution for the correction of one-directional velocity encoding is provided. Dependent upon the spatial location of the velocity measurements, the magnitude of encoding errors can be as high as 60% while errors in the encoding direction can be up to 45°. Results of phantom measurements demonstrate that effects of gradient field non-uniformity on PC-MRI can be corrected in accordance with the invention.

To model the spatial imperfections of the magnetic field $B_{z,model}^{(i)}(r)$ produced by the gradient coils along nominal directions i=x, y, and z, a polynomial model based on a spherical harmonic expansion is generally employed [6], although other models can also be used. Scanner specific parameters are included in the coefficients used to describe the spatial dependence of the gradient field (appendix, equation A1).

Based on the model, local magnetic field gradients $G_{ji,model}(r)$ can be calculated according to $$G_{ji,model}(r) = \frac{\partial B_{z,model}^{(i)}(r)}{\partial j} \quad i, j = x, y, \text{ and } z. \quad (1)$$

In this context $G_{ji,model}(r)$ describes the component of the gradient along j for an ideal (nominal) gradient along i. $G_{ii,model}(r)$ therefore is the component of the actual gradient field along the selected gradient field direction (self term), while $G_{ji,model}(r)$ with i≠j are gradient terms orthogonal to the primarily selected gradient direction (cross terms).

As a result, the true gradient field demonstrates not only deviations from the nominal gradient strength but also from the original gradient direction i. The relative deviation from the ideal (spatially constant) gradient field $G_{i,ideal}$ of the actual (modeled) field strength $G_{ji,model}(r)$ is:

$$\Lambda_{ji}(r) = \frac{G_{ji,model}(r)}{G_{i,ideal}} \quad i, j = x, y, \text{ and } z \quad (2)$$

for each physical gradient axis i=(x, y, z). Here, the vector $r=(x,y,z)^T$ reflects the true (already spatially unwarped) position.

Generalized Reconstruction

The relative field deviations $\Lambda_{ji}(r)$ result in a relative error in the associated first gradient moments and therefore velocity induced phase shift in phase contrast MRI. With the ideal first moment $M_{1,ideal}$ for an ideal arbitrary gradient $G_{ideal}(t)$ given by $$M_{1,ideal} = \int_0^{TE} G_{ideal}(\tau)\tau d\tau \quad (3)$$

and equations (1) and (2) the actual first moment $M_1(r)$ is now spatially dependent and can be calculated using the matrix $\Lambda(r)$ which contains the relative field deviations $\Lambda_{ji}(r)$:

$$M_1(r) = \begin{pmatrix} M_{1,x}(r) \\ M_{1,y}(r) \\ M_{1,z}(r) \end{pmatrix} = \int_0^{TE} \begin{pmatrix} \Lambda_{xx}(r) & \Lambda_{xy}(r) & \Lambda_{xz}(r) \\ \Lambda_{yx}(r) & \Lambda_{yy}(r) & \Lambda_{yz}(r) \\ \Lambda_{zx}(r) & \Lambda_{zy}(r) & \Lambda_{zz}(r) \end{pmatrix} \begin{pmatrix} G_{x,ideal}(\tau) \\ G_{y,ideal}(\tau) \\ G_{z,ideal}(\tau) \end{pmatrix} \tau d\tau \quad (4)$$

$$= \Lambda(r) \int_0^{TE} G_{ideal}(\tau)\tau d\tau = \Lambda(r) M_{1,ideal}$$

For a typical phase contrast experiment, the actually measured phase difference $\Delta\phi(r)$ with encoding along a single (arbitrary) direction (assuming constant velocity v(r) and a gradient waveform with zero net area at echo time TE) is therefore given by $$\Delta\phi(r) = v(r)^T \gamma [\Lambda(r) M_{1,ideal}^{(I)} - \Lambda(r) M_{1,ideal}^{(II)}] \quad (5)$$

$$= v(r)^T \gamma \Lambda(r) \Delta M_{1,ideal}$$

$$= \gamma [\Lambda(r) \Delta M_{1,ideal}]^T v(r).$$

The two different ideal first moments along one gradient direction which are necessary to encode a single flow direction are denoted by $M_{1,ideal}^{(I)}$ and $M_{1,ideal}^{(II)}$; $\gamma$ is the gyromagnetic ratio. The velocity sensitivity of the experiment is determined by the difference $\Delta M_{1,ideal}$ in first moments.

For the most general case, a phase difference vector $\Delta\Phi(r)=(\Delta\phi_1(r),\Delta\phi_2(r),\ldots,\Delta\phi_N(r))^T$ resulting from velocity encoding along N different (arbitrary) directions (with nominal velocity sensitivities characterized by an (N×3) encoding matrix $\Omega=(\Delta M_{1,ideal}^{(1)},\Delta M_{1,ideal}^{(2)},\ldots,\Delta M_{1,ideal}^{(N)}))$ can be written as $$\Delta\Phi(r)=\gamma[\Lambda(r)\Omega]^T v(r). \quad (6)$$

Note that in this notation, superscripts on $M_1$ (e.g., $M_{1,ideal}^{(I)}$, $M_{1,ideal}^{(II)}$ identify first moments of subsequent individual measurements, whereas superscripts on $\Delta M_1$ (e.g., $\Delta M_{1,ideal}^{(1)},\Delta M_{1,ideal}^{(N)}$) denote velocity sensitivities (differences in first moments) corresponding to different encoding directions.

For a general correction for gradient field inhomogeneities the true velocities of underlying flow or motion can therefore be recovered from the measured phase differences by inverting $[\Lambda(r)\Omega]^T$ and solving equation (6) for v(r):

$$v(r) = \frac{1}{\gamma}[\Lambda(r)\Omega]^{-T} \Delta\Phi(r). \quad (7)$$

In the general case, the true velocity vector can only be recovered from the phase difference data if at least three-directional velocity encoding (N=3) was performed. A more general discussion of the solutions of equation (6) and the role of Singular Value decomposition (SVD) in the over- or underdetermined case is given in the appendix.

In conventional reconstruction of velocity data from phase contrast measurements, on the other hand, gradient field deviations are ignored and velocity components are calculated simply by scaling the phase difference images according to the magnitude of the ideal first moment differences $\Delta M_{1,ideal}^{(i)}$ for each encoding direction independently:

$$v_i(r) = \frac{1}{\gamma \Delta M_{1,ideal}^{(i)}} \Delta \phi_i(r), i = 1, \ldots, N. \quad (8)$$

A more detailed description of the standard reconstruction is given in Bernstein et al., "Reconstructions of Phase Contrast, Phased Array Multicoil Data," Magn. Reson. Med. 1994; 32(3):330–4.

Implications of the generalized reconstruction (equation (7)) on typical applications of phase contrast MRI such as velocity encoding along a single axis (N=1) and along three orthogonal axes (N=3) are given in the appendix.

Single-Direction Encoding

In some applications (e.g., single-direction encoding which is quite frequently used to measure volumetric flow rate) the full three-directional velocity information is not available (see also equation A2, appendix). In these cases, one is usually interested in the through plane component of the velocity in order to determine the flow along this direction. Due to the gradient non-uniformities, the flow encoding is changed in both magnitude and direction. However, the local slice select direction is also altered and is parallel to the actual, local, flow encoding direction. This parallel relationship is ideal for flow quantitation, and for this application, it is sufficient to correct for the magnitude error in the flow encoding. Suppose the intended flow encoding (and slice select) direction is along the direction of the unit vector n with the ideal first moment for single-direction encoding represented by $\Delta M_{1,ideal}^{(1)} = \Delta M_{1,ideal}^{(1)}$ n. In general, the actual velocity encoding and slice select direction is given by $n'(r) = \Lambda(r)n/\|\Lambda(r)n\|$ and the velocity component normal to the excited slice at the location r along the actual velocity encoding direction is $v_\perp(r) = n'(r)^T v(r) = [\Lambda(r)n]^T v(r)/\|\Lambda(r)n\|$. For single-direction velocity encoding equation (6) becomes $$\Delta \phi_1(r) = \gamma [\Lambda(r) \Delta M_{1,ideal}^{(1)}]^T v(r) = \gamma \Delta M_{1,ideal}^{(1)} [\Lambda(r)n]^T v(r) = \gamma \Delta M_{1,ideal}^{(1)} v_\perp(r) \|\Lambda(r)n\| \quad (9)$$

and the velocity normal to the local excited slice is $$v_\perp(r) = \frac{\Delta \phi_1(r)}{\gamma \Delta M_{1,ideal}^{(1)} \sqrt{\sum_{j=1}^{3} \left[ \sum_{i=1}^{3} n_i \Lambda_{ji}(r) \right]^2}} \quad (10)$$

For the special case where n points along i=x,y, or z, equation (10) reduces to $$v_\perp(r) = \frac{\Delta \phi_1(r)}{\gamma d_i \Delta M_{1,ideal}^{(1)}} \quad (11)$$

with $d_i = (\Lambda_{ii}^2 + \Lambda_{ji}^2 + \Lambda_{ki}^2)^{1/2}$ where j and k are the corresponding orthogonal directions. Note that equations (10) and (11) offer accurate reconstruction of $v_\perp(r)$, but the actual flow direction and speed are generally not known.

In other applications of single-direction encoding the velocity component along the intended encoding direction n ($v_n(r)$) may be of interest. It is important to note that, in general, it is impossible to exactly reconstruct $v_n(r)$ in the presence of gradient field inhomogeneity. However, an approximate solution may be useful in some cases when the direction error is small or if it can be assumed that the true flow is predominantly along n (i.e., $v(r)=v_n(r)n$). In this approximation the velocities $v_n(r)$ can be estimated by $$v_n(r) = \frac{\Delta \phi_1(r)}{\gamma \Delta M_{1,ideal}^{(1)} \sum_{i,j} n_i n_j \Lambda_{ij}} \quad (12)$$

Note that, for encoding along one of the Cartesian directions i=x,y or z the sum in equation (12) reduces to the self term $\Lambda_{ii}(r)$ along the intended encoding direction i.

The case described above pertained to the application in which a single velocity component was desired and no a-priori knowledge of the true flow direction was available. In the event the true flow direction is known or some assumptions about velocity ratios can be made (e.g., $v_z = m v_y$ and $v_z = l v_x$), the cross terms can be included in the reconstruction and one-directional velocity encoding along the intended encoding direction n can be fully corrected using equation (7).

In demonstrating the invention, all measurements were performed on a 1.5T system (Signa CV/i, GE, Milwaukee, Wis., $G_{max}$=40 mT/m, risetime=268 µs).

The phantom used for all measurements consisted of a tube (diameter=20 mm), parallel to the direction of the main magnetic field (z), which could be moved to different (x-y) locations in the axial plane. A computer controlled pump was used to generate a constant laminar flow at a rate of 25 ml/s. A long tube (2 meters) was used to ensure that velocity profiles were fully developed before they entered the imaging volume.

In order to demonstrate velocity encoding errors related to gradient field non-uniformity and the feasibility of both the generalized reconstruction (equation (7)) and the approximate solution (equation (12)) two sets of phantom experiments were performed with full three-directional and one-directional through-plane velocity encoding, respectively.

For all experiments, the 3D volume or a set of 2D slices were prescribed within a volume so as to cover a large extent of gradient field inhomogeneities. Data acquisition was performed with an in-plane image matrix of 256×256, a FOV of 40-cm and velocity encoding (venc) of 30 cm/s.

For the analysis of the generalized phase contrast reconstruction 3D scans were performed with a coronal (x-z) slab using a RF-spoiled gradient echo sequence (TE=3 ms, TR=10.3 ms, BW=+/−62.5 kHz, α=15°) with identical velocity encoding (venc=30 cm/s) along all three spatial directions. The slab thickness was adjusted to include the whole tube (slab thickness=72 mm, 24 slice encodes).

During a second set of phantom measurements a 2D RF-spoiled gradient echo sequence with velocity encoding along a single direction was used (TE=3.9 ms, TR=9 ms, α=20°) to demonstrate the feasibly of the approximate correction (equation (12)). Twenty-one equally spaced axial images (slice thickness=10 mm, gap=10 mm) were acquired with through-plane flow encoding only.

In order to correct for the effect of eddy current and system imperfections other than gradient inhomogeneities, the measured phase difference images for each experiment was referenced to a scan with the pump off (i.e., no flow) but otherwise identical parameters.

All gradient field calculations and data reconstruction were performed using MATLAB (The MathWorks, USA) on a personal computer. Images were computed with the proposed generalized and also with standard phase contrast reconstruction algorithms.

The magnitude and velocity images from the 3D data set were completely spatially unwarped (in 3D). The data were then used to generate two-dimensional intensity plots and cross sectional velocity profiles for generalized and standard phase contrast reconstruction.

For the second set of phantom experiments, images were unwarped in 2D and the data were quantitatively analyzed by calculating the mean through plane velocities for the 21 equally spaced axial slice planes. Velocities were calculated within ROIs that were defined at the different tube locations in the x-y-plane for each slice. Since gradient field distortions also affect slice plane locations and are not corrected by the scanner's unwarping software (the correction is only done in the in-plane dimensions) the slice (z) position for each calculated $\bar{v}_z$ for each tube was also corrected for mis-mapping and moved back to its true location.

Gradient Field Distortions

Figure 1B:
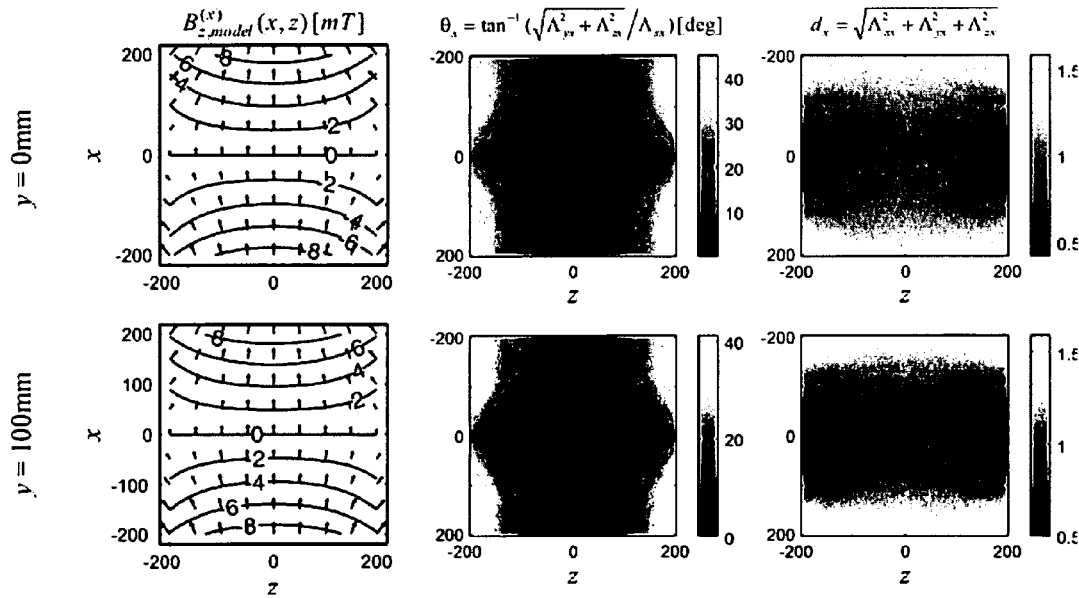
Figure 1C:
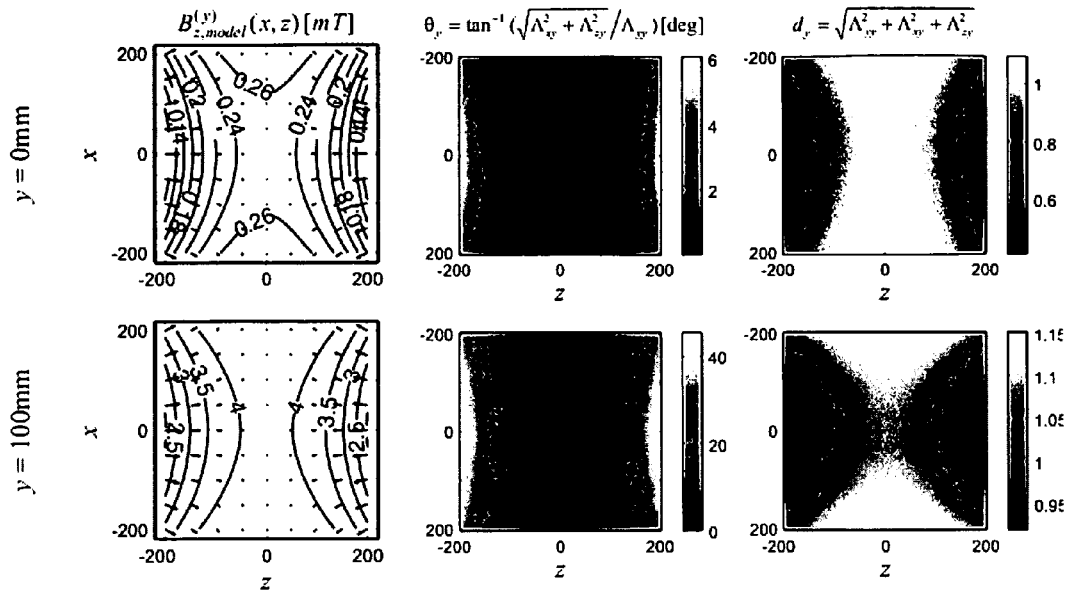

FIGS. 1A, 1B, and 1C are simulated iso-contours (labeled in units of mT) for the magnetic field $B_{z,model}^{(i)}(x, z)$ generated by the i-gradient coil (i=x,y,z, A: z-gradient coil, B: x-gradient coil, C: y-gradient coil) in coronal planes at y=0 mm and y=200 mm (left column). The overlaid vector field represents the projection of the magnetic field gradient into the coronal plane. Angular deviations $\theta_i(x,z)$ in degrees and relative strength variation $d_i(x,z)$ from the nominal gradient field are displayed as gray-scaled images. All plots reflect gradient fields within coronal planes with a FOV of 400 mm; x, y and z coordinates are given in mm. Note that, according to the model, gradient field distortions for gradient coil axes along x and y axis are identical but transposed.

FIG. 1 illustrates the spatial dependence of gradient field distortions derived from a gradient field model given including the calibration coefficients of our system. If the z-gradient coil is energized the spatial gradient field imperfection can be characterized by the local angular deviation from the nominal gradient direction $\theta_z = \tan^{-1}((\Lambda_{xz}^2 + \Lambda_{yz}^2)^{1/2}/\Lambda_{zz})$ and the local absolute deviation from nominal gradient strength $d_z = (\Lambda_{zz}^2 + \Lambda_{xz}^2 + \Lambda_{yz}^2)^{1/2}$. Analogous expressions are defined for x- and y-coils.

FIGS. 1A–1C show iso-contours of the modeled magnetic field $B_{z,model}^{(i)}(x, z)$ generated by the i-gradient coil (i=x,y,z) in coronal planes through the iso-center of the magnet (y=0 mm, top row) and off-center at y=100 mm (bottom row). The overlaid vector field represents the projection of the magnetic field gradient into the coronal plane. Angular and absolute deviations from the nominal gradient field are illustrated by intensity plots of $\theta_i(x,z)$ and $d_i(x,z)$, respectively. Note that FIG. 1C depicts gradient fields with a principal gradient direction perpendicular to the coronal plane.

Ideal gradient fields would result in equidistant contour lines of the magnetic field in FIGS. 1a and 1b and spatially constant $B_{z,model}^{(y)}(x, z)$ in FIG. 1C. Deviations from those ideal conditions are clearly visible for all three gradient axes. In principle, based on the gradient field model, encoding errors can be as high as +/−60% in magnitude and up to 45° in angular deviations within a volume of (400 mm)³, depending on the spatial location and encoding direction. Table 1 lists maximum angular and absolute deviations for all three gradient coils (x and y coils are identical but rotated) within two different volumes ((200 mm)³ and (400 mm)³) centered at the iso-center of the magnet. Note that the deviations from nominal gradient strength $d_i$ directly correspond to locally varying errors in through-plane velocity components $v_\perp(r)$ for single-direction encoding, which can be fully corrected using equation (11).

TABLE 1

Maximum deviations in gradient strength $d_i$ and orientation $\theta_i$ (i = x, y, z) for measurement volumes of (200 mm)³ and (400 mm)³.

|  | max($\theta_i$) [deg] | | max($d_i$) [%] | |
| --- | --- | --- | --- | --- |
|  | x, y-gradient coil | z-gradient coil | x, y-gradient coil | z-gradient coil |
| (200 mm)³ volume | 13.2° | 1.1° | 12% | 4% |
| (400 mm)³ volume | 45.1° | 16.2° | 63% | 67% |

From both FIG. 1 and Table 1 it is evident that deviations in the strength of the encoding typically increase with distance from the iso-center of the magnet while the angular deviation demonstrates more complex patterns. In addition, the x- and y-gradient coils produce stronger deviations from the nominal fields than the z-gradient coil. Symmetries in the gradient field model are a result of the fact that the physical x- and y-gradient coils are identical but rotated.

Generalized Reconstruction

Figure 2A:
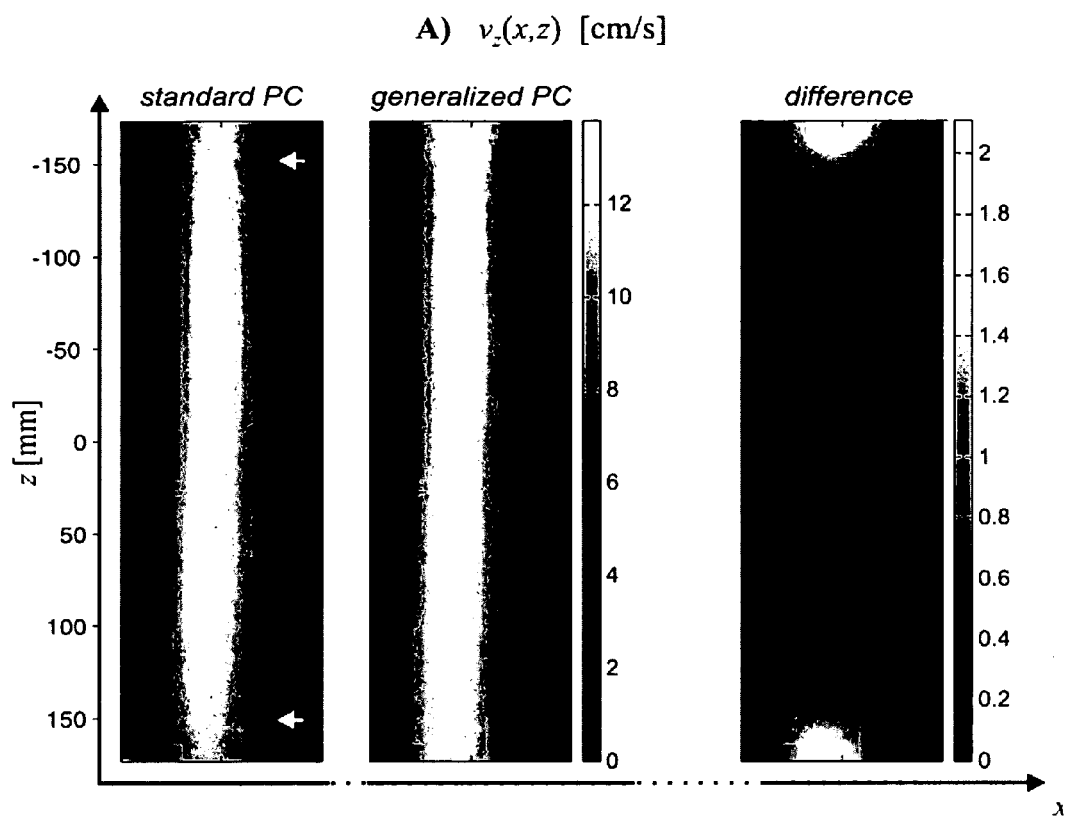
FIGS. 2A, 2B show results of 3D phase contrast MRI measurements with three-directional velocity encoding including two dimensional intensity plots reflecting velocity profiles in the coronal (x-z) plane for FIG. 2A) velocities encoded along z, and FIG. 2B) velocities encoded along y.
Figure 2B:
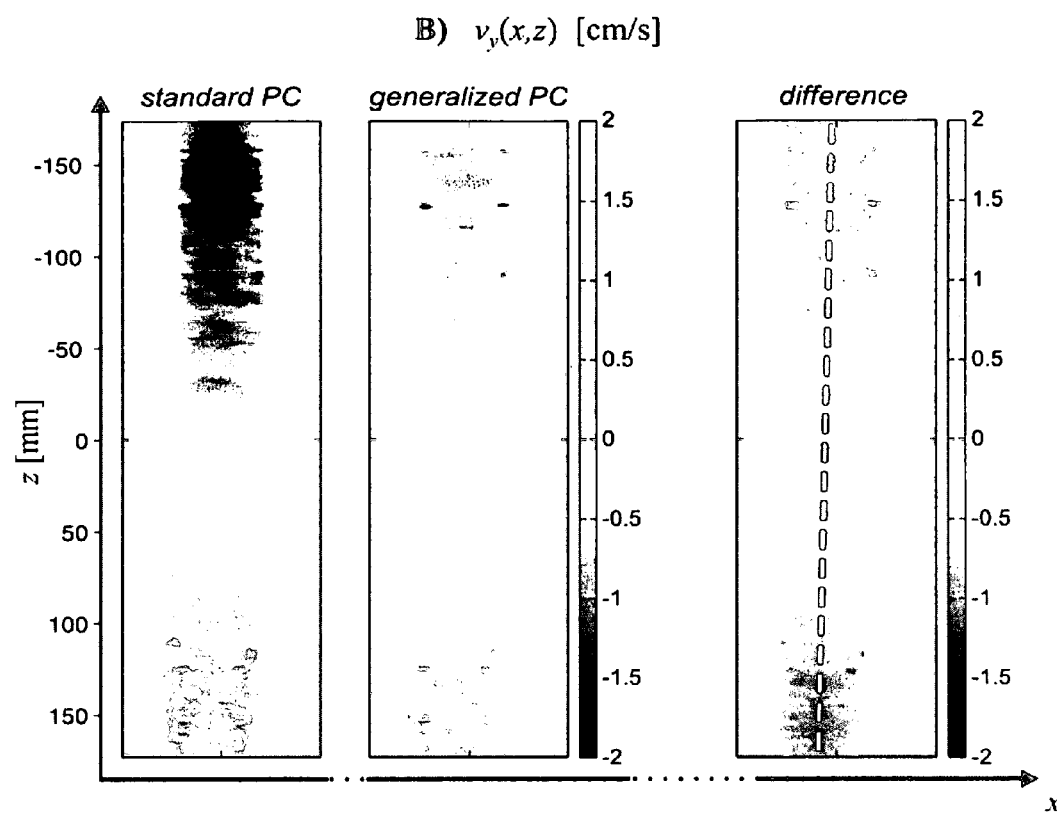

FIGS. 2A and 2B illustrate 3D phase contrast MRI with three-directional velocity encoding: two dimensional intensity plots reflecting velocity profiles in the coronal (x-z) plane for A) velocities encoded along z and B) velocities encoded along y. The center of the tube phantom was close to the iso-center of the magnet (y=−20 mm). Each set of images shows velocity profiles for standard (left, standard PC, equation (8)) and generalized phase contrast reconstruction (middle, generalized PC, equation (7)) as well as the difference between both methods (right).

FIG. 2 depicts results of the 3D phantom measurement with three-directional velocity encoding. The intensity plots show pixel wise velocity profiles calculated by standard (equation (8)) and generalized phase contrast reconstruction (equation (7)) as well as difference images. All images correspond to a thin coronal slab (12 mm, 60% of the tube diameter) within the 3D volume transecting the center of the tube phantom. The data therefore represent the through slab average of the velocities which are somewhat lower than the expected peak velocities (approx. 16 cm/s for a flow rate of 25 ml/sec).

The effects of gradient field non-uniformity on apparent flow velocity profiles can clearly be identified and are most significant for velocity components $v_z(x,z)$ along the principal flow direction (z-direction, FIG. 2A). Note the falloff of uncorrected velocities at the edges of the FOV (arrows), which are reduced with the generalized PC reconstruction, as demonstrated by the high intensities near the edges in the difference image. This behavior is also consistent with the spatial variation of relative gradient strength of the respective gradient axis (z) used for velocity encoding as depicted in FIG. 1A for a similar coronal location (top right, $d_z(x,z)$ for y=0 mm).

However, apparent velocities along directions orthogonal to the tube axis such as $v_y(x,z)$ (y-direction, FIG. 2B) are also affected by gradient field non-uniformity. The non-zero apparent velocities along y for the standard reconstruction (FIG. 2B, left plot) can be explained by the direction error associated with the gradient field used for encoding of the y-velocities. Any deviation from the nominal direction will result in an unwanted contribution of the strong z-velocities to the intended y-encoding direction. The increase of $v_y$ with distance from the iso-center agrees well with the spatial dependence of the of angular deviation from the nominal encoding direction depicted in FIG. 1C for a similar coronal location (top, mid, $\theta_y(x,z)$ for y=0 mm).

from simulations based on the gradient field model. Table 2 lists the resulting maximum reconstruction errors (percentage deviation of the encoded velocity component from the actual velocity component) for encoding along the z and x within two different volumes ($(200\text{ mm})^3$ and $(400\text{ mm})^3$) centered at the iso-center of the magnet. Errors were calculated for identical velocity components ($v_x = v_y = v_z$) and a more practical example corresponding to flow velocities directed mostly along the principal encoding axis ($v_x = v_y = \frac{1}{4} v_z$ for encoding along z, $v_z = v_y = \frac{1}{4} v_x$ for encoding along x). For comparison, the errors for the standard phase contrast processing (equation (8)) are also listed.

TABLE 2

Comparison of maximum errors in encoded velocities for standard and approximate reconstruction within measurement volumes of $(200\text{ mm})^3$ and $(400\text{ mm})^3$, for two cases: (1) equal velocities in all directions and (2) velocity in the encoding direction is 4 times larger than in the other two directions.

| | Max. reconstruction error, encoding using z-gradient coil[#] | | | | Max. reconstruction error, encoding using x-gradient coil[##] | | | |
|---|---|---|---|---|---|---|---|---|
| | (1) $v_x = v_y = v_z$ | | (2) $v_x = v_y = \frac{1}{4} v_z$ | | (1) $v_x = v_y = v_z$ | | (2) $v_z = v_y = \frac{1}{4} v_x$ | |
| | standard PC | approx. Recon | standard PC | approx. Recon | standard PC | approx. Recon | standard PC | approx. Recon |
| $(200\text{ mm})^3$ volume | 5% | 3% | 4% | 1% | 31% | 27% | 13% | 7% |
| $(400\text{ mm})^3$ volume | 94% | 41% | 72% | 10% | 153% | 108% | 70% | 27% |

[#]One-directional velocity encoding along z
[##]One-directional velocity encoding along x Both figures demonstrate that the gradient field induced errors can be corrected with the proposed generalized reconstruction (equation 7). Relatively constant laminar velocity profiles along z, as expected from steady flow conditions and phantom location, can be regained along the entire tube after employing the generalized phase contrast reconstruction. The remaining velocity gradient for $v_y$ may be due to residual deviations between the model and real gradient fields.

In addition, it is evident that the divergence from nominal velocity increases with distance from the iso-center of the magnet and deviations can be as large as 25% for this phantom location.

Figure 3A:
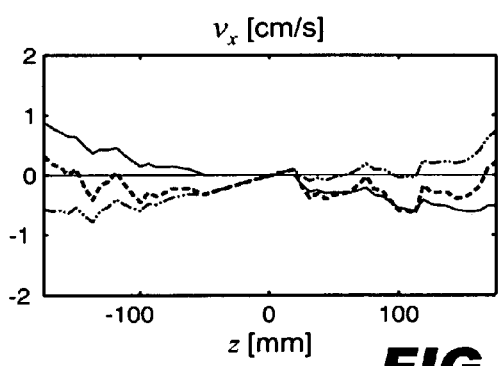
FIGS. 3A–3C show results of 3D phase contrast MRI measurements with three-directional velocity encoding including measured velocities $v_x$, $v_y$ and $v_z$ along cross sections through the center of the tube phantom (as indicated by the dashed line in the right plot in FIG. 2B) with each graph showing velocities for standard (solid gray line, standard PC) and generalized phase contrast reconstruction (thick black dashed line, generalized PC) as well as the difference between both methods (black dot-dashed line).
Figure 3C:
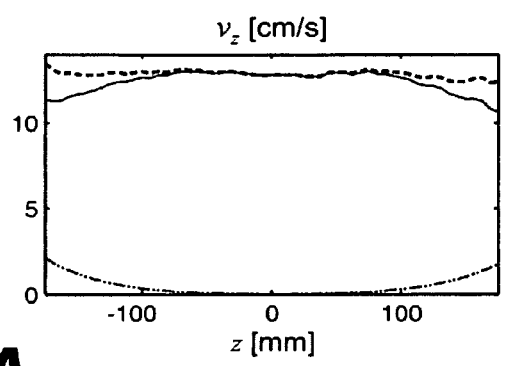
Figure 3B:
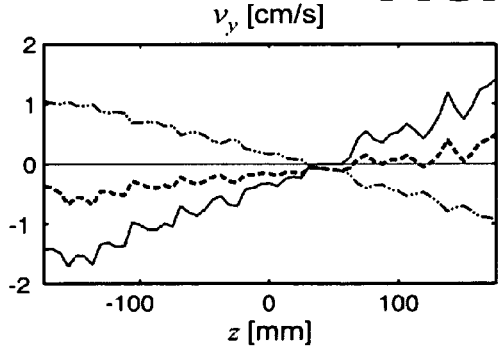

The effects of standard and generalized reconstruction are further illustrated in the graphs in FIGS. 3A–3C for $v_x$, $v_y$, and $v_z$. Velocities for all encoding directions (x,y and z) are shown through the center of the tube as indicated by the dashed line in FIG. 2B (right). In FIGS. 3A–3C, 3D phase contrast MRI with three-directional velocity encoding includes measured velocities $v_x$, $v_y$ and $v_z$ along cross sections through the center of the tube phantom (as indicated by the dashed line in the right plot in FIG. 2B). Each graph shows velocities for standard (solid gray line, standard PC) and generalized phase contrast reconstruction (thick black dashed line, generalized PC) as well as the difference between both methods (black dot-dashed line).

Approximate Reconstruction

To estimate the error associated with the approximate reconstruction (equation (12)) compared to the generalized method (equation (7)), relative deviations from true velocities for one-directional velocity encoding were generated From Table 2, it is evident that standard phase contrast reconstruction for one-directional velocity encoding results in significant errors in the encoded velocities which can be as large as 150%. Especially for the z-gradient coil those errors can be considerably reduced using the approximate reconstruction. Even for a large volume of $(400\text{ mm})^3$ most of the deviation of gradient strength is already determined by the self terms and can therefore be corrected using equation (12). Velocities measured using the x-gradient coil, on the other hand, do not benefit as much from the approximate correction. Here, cross terms play a more significant role which is also demonstrated in the field plots for x- and y-gradient coils in FIG. 1 (x and y coils are identical but rotated). Nevertheless, if the flow direction is located mostly along the encoding direction, even for the x or y gradient coil the maximum encoding error can be reduced by approximately 50% and it is worthwhile performing the correction if only one-directional velocity data is available.

In general, the improvement in accuracy can be maximized if the encoding direction is adjusted to match the principal flow direction (e.g., for $v_x \gg v_z$, $v_y$ for encoding along x).

Figures 4A, 4B:
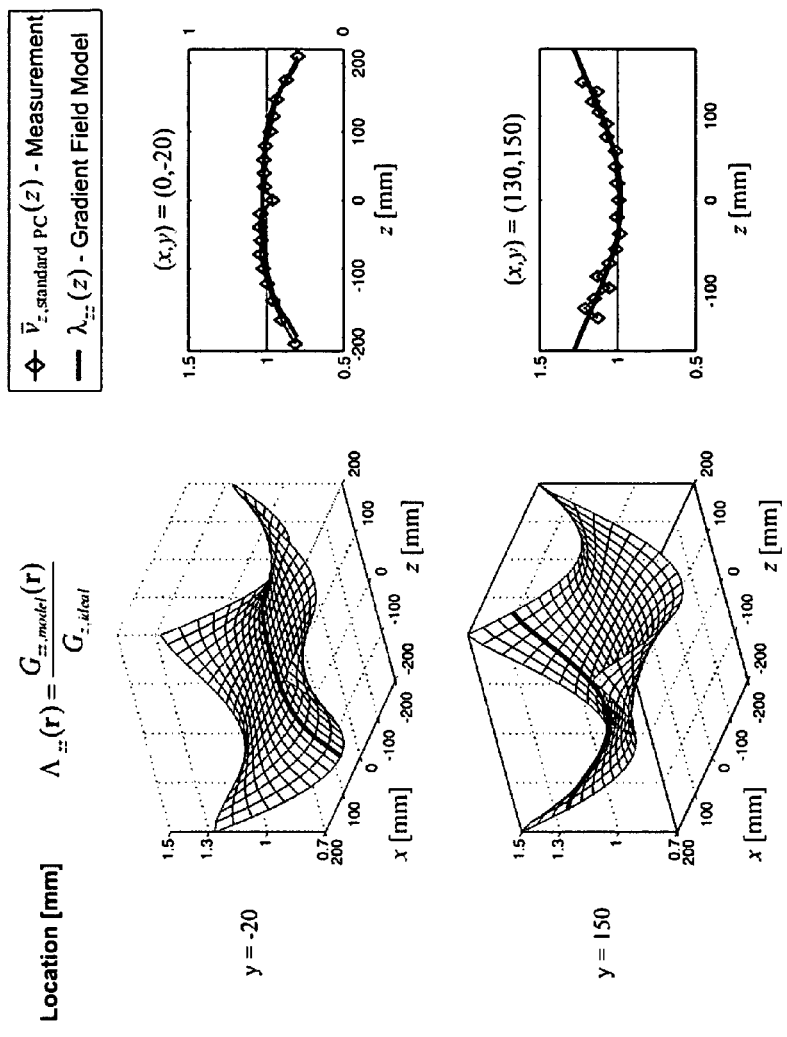
FIGS. 4A, 4B show results of 2D phase contrast MRI measurements with one-directional velocity encoding and demonstrates the effect of gradient field inhomogeneities on velocity encoding for locations of the tube phantom as defined by the (x,y) coordinates.

Results of the 2D phantom experiments with one-directional velocity encoding are shown in FIG. 4. The theoretically predicted inhomogeneity of z-gradient fields used for the approximate description (equation (12)) of errors in the encoded velocity are shown in the left column. The surface plots of $\Lambda_{zz}(x,z)$ demonstrate the relative deviations from nominal z-gradient strength in the coronal plane for specific tube y-positions. FIGS. 4A and 4B illustrate 2D phase contrast MRI with one-directional velocity encoding: demonstration of the effect of gradient field inhomogeneities on velocity encoding for locations of the tube phantom as defined by the (x,y) coordinates. Simulated and normalized z-gradient fields (left) depict the spatial variation of the relative deviation $\lambda_{zz}$(x, z) from the ideal gradient strength in coronal planes at the respective phantom locations for a FOV of 400 mm. Measured through plane velocities are compared to predicted measurement errors (dark lines) for both phantom locations. Note that the slice locations for the measured velocities have been corrected for gradient field distortions.

Mean measured velocities $\bar{v}_{z,standard\ PC}$ were scaled to represent local deviations from ideal gradients (i.e., for $\Lambda_{ii}$=1) and could thus be directly compared to relative changes in gradient strength. Results are displayed as a function of slice location (z) (right column). The thick solid lines in all graphs indicate the z-gradient according to the model for corresponding phantom locations (given as (x,y) in mm).

Figure 5:
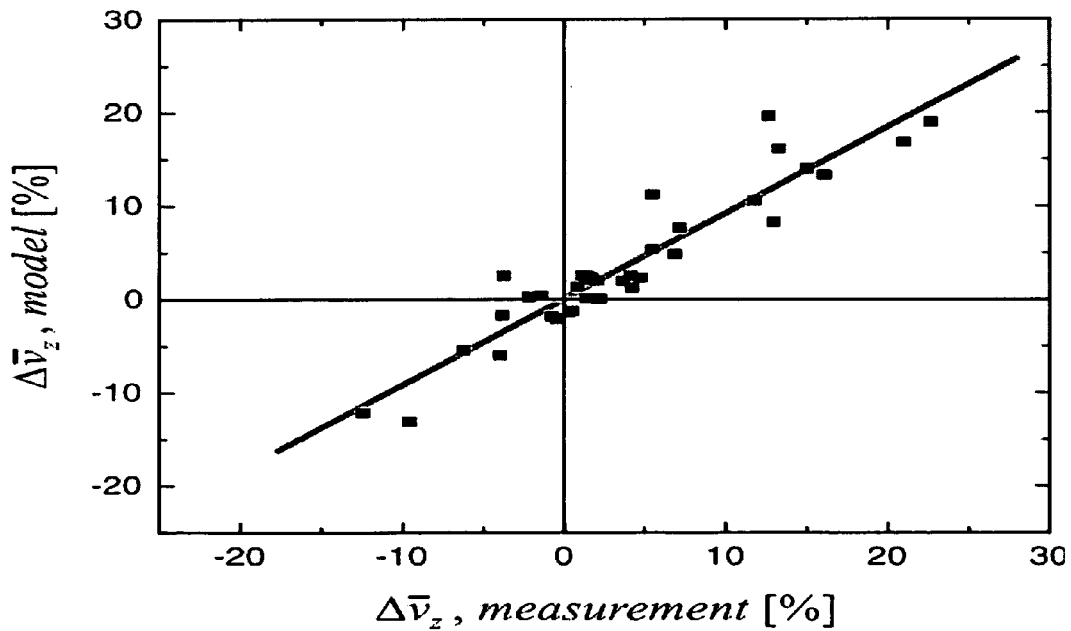
FIG. 5 illustrates 2D phase contrast MRI with one-directional velocity encoding including correlation of measured versus model based deviations $\Delta \bar{v}_z$ from through plane velocities.

Since steady flow was used for all experiments, the true mean through plane velocities are expected to be constant as a function of spatial location (z) along the tube. As shown in FIG. 4, the deviations of the velocities measured demonstrates the effect of gradient field non-uniformity and corresponded well to the theoretically predicted errors for different phantom locations. This is further demonstrated in FIG. 5 which shows excellent correlation between predicted velocity errors and the measured through plane velocities (linear regression, slope=0.92+/−0.06, intercept=0.05+/−0.51, r=0.94). In FIG. 5, 2D phase contrast MRI with one-directional velocity encoding includes correlation of measured versus model based deviations $\Delta\bar{v}_z$ from through plane velocities. Velocities were scaled to represent percentage deviations from conditions with ideal gradients. The solid line represents the result of a linear regression.

Since the measured errors are in agreement with predictions, an approximate error correction can be performed by a simple scalar multiplication of the measured velocities by spatially dependent values $\Lambda_{zz}$(z) derived from the theoretical model of the gradient fields.

With the demand for high gradient strength and slew rates, systems with short gradient coils are being used and gradient non-uniformity can be a significant problem. Corrections are available to remove spatial distortions that result from imperfect spatial encoding. However, errors introduced into phase contrast measurements have not been thoroughly reported.

The effect of gradient field imperfections on strength and orientation of velocity encoding demonstrates the necessity for a more generalized reconstruction of PC-MRI data. In general, accurate reconstruction of magnitude and direction of velocities can be achieved if three-directional velocity encoding is performed and an appropriate correction that includes the direction error is applied.

The simulations and velocity measurements demonstrate that gradient field inhomogeneities can introduce significant errors in magnitude and direction in quantitative phase contrast flow or velocity measurements. Comparison of standard and generalized reconstruction of three-directional phase contrast data demonstrate that a gradient field model based on a spherical harmonic expansion can be used to compensate for magnitude and angular deviations in first gradient moments and thus velocity encoding. The relevant parameters for the field model are system dependent.

From both model and measurements it is evident that the errors in velocity encoding strength increase with distance from the iso-center of the magnet while the angular deviation demonstrates more complex patterns. In general, through plane velocity measurements with a single slice placed at or near the center of the magnet and with the vessel of interest close to the center of the FOV are largely insensitive to encoding errors. The situation differs considerably, however, if multiple slices are acquired within a single acquisition or if blood flow is to be analyzed within a larger plane or volume.

The effect on the magnitude of encoded velocities strongly depends on the off center location of the object and can, in our system, be as large as 10% within a (200 mm)$^3$ volume and 65% within a (400 mm)$^3$ volume. Angular deviations, can result in encoding direction errors up to 16° within a (200 mm)$^3$ volume and 45° within a (400 mm)$^3$ volume.

Especially for measurements within smaller volumes, the direction error (contribution from cross terms) may be ignored and encoded velocities can be corrected by a simplified method (equation (12)). This simplified version effectively ignores any deviation from the original encoding direction but has the advantage that one-directional velocity measurements can be corrected since cross terms are neglected.

Although accurate reconstruction would require the full three-directional velocity information the second set of phantom experiments demonstrate that the error in through plane velocities could be successfully described by this approximate correction. Even though not all gradient field deviations are accounted for and some encoding error remains, significant improvement could be achieved if compared to the uncorrected data.

It has to be noted, however, that the excellent correlation obtained in the analysis of the phantom data is also due to the special geometry used herein. Since, according to the gradient field model, the encoded velocity is not in general parallel to the true velocity, directional errors and thus cross-terms may be more significant for different geometries with major flow components not along the principal velocity encoding direction.

Gradient non-uniformities also cause distortion of the excited slice in 2D imaging (gradient non-linearities causes an RF pulse to excite spins that are not within a flat plane, 'potato-chip shape').

The local normal to the excited slice is parallel to the local gradient direction. Thus, if flow encoding is in the "slice direction", the flow encoding is parallel to the local normal to the slice, as would be desired. The slice distortion could cause the image to not contain the desired anatomy, but the effect is difficult to estimate since these errors are dependent on the local gradient field deviations and as such highly dependent on the location of the anatomy within the slice, as well as the slice plane location itself. However, assuming the image contains the vessel of interest, if the measured slice is corrected for spatial distortion and the velocity measurement is corrected for the error in the flow encoding strength, the measured volume flow rate should be correct. Note that in this case, correction for the error in the flow encoding direction would be counterproductive.

In summary, deviations related to gradient field inhomogeneities need to be taken into account if such gradient fields are used to encode flow as in phase contrast MRI. Significant improvement in velocity quantification can be achieved by using the known field distortions to correct the measured phase shifts. After spatial unwarping, errors in quantitative phase contrast measurements can be greatly reduced with relatively little effort by using the generalized reconstruction algorithm in accordance with the invention.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

APPENDIX

Gradient field model:

To model the spatial dependence of the field generated by each gradient coil (i=x, y, or z coil) a spherical harmonic expansion is employed:

$$B_{z,model}^{(i)} = (r) = \sum_{k=0}^{\infty} \sum_{l=0}^{k} \alpha_{kl}^i H_{kl}^C(r) + \beta_{kl}^i H_{kl}^S(r), \, i = x, y \text{ and } z. \quad (A1)$$

$H_{kl}^C(r)$ and $H_{kl}^S(r)$ are the solid spherical harmonic basis functions and $\alpha,\beta$ represent coefficients that are specific for an individual MR unit and typically provided by the manufacturer. For each gradient coil three terms are included in the expansion. From the model, it can be shown (see FIG. 1) that an energized gradient coil produces not only changes in $B_z$ along the nominal gradient orientation but also in the two orthogonal directions.

Generalize Reconstruction—Common Special Cases

In this section examples of the application of the generalized reconstruction (equation (7)) for typical velocity encoding in phase contrast MRI are given.

If one-directional velocity encoding is performed with an encoding gradient $G_{z,ideal}(\tau)$ along the nominal z-axis only ($G_{x,ideal}(\tau)=G_{y,ideal}(\tau)=0$) the true first gradient moment is given by:

$$M_1(r) = \begin{pmatrix} M_{1,x}(r) \\ M_{1,y}(r) \\ M_{1,z}(r) \end{pmatrix} \quad (A2)$$

$$= \int_0^{TE} \begin{pmatrix} \Lambda_{xx}(r) & \Lambda_{xy}(r) & \Lambda_{xz}(r) \\ \Lambda_{yx}(r) & \Lambda_{yy}(r) & \Lambda_{yz}(r) \\ \Lambda_{zx}(r) & \Lambda_{zy}(r) & \Lambda_{zy}(r) \end{pmatrix} \begin{pmatrix} 0 \\ 0 \\ G_{z,ideal}(\tau) \end{pmatrix} \tau d\tau$$

$$= \begin{pmatrix} \Lambda_{xz}(r) \\ \Lambda_{yz}(r) \\ \Lambda_{zz}(r) \end{pmatrix} \int_0^{TE} G_{z,ideal}(\tau)\tau d\tau = \begin{pmatrix} \Lambda_{xz}(r) \\ \Lambda_{yz}(r) \\ \Lambda_{zz}(r) \end{pmatrix} M_{1,z,ideal}(\tau)$$

As a result, the actually measured phase also includes cross-tern contributions from orthogonal gradient terms determined by $\Lambda_{zx}(r)$ and $\Lambda_{zy}(r)$. The measured phase difference $\Delta\phi_z(r)$ in this case is thus given by $$\Delta\phi_z(r) = v(r)^T \gamma \begin{pmatrix} \Lambda_{xz}(r) \\ \Lambda_{yz}(r) \\ \Lambda_{zz}(r) \end{pmatrix} \Delta M_{1,z,ideal} \quad (A3)$$

$$= \gamma[v_x(r)\Lambda_{xz}(r) + v_y(r)\Lambda_{yz}(r) + v_z(r)\Lambda_{zz}(r)]\Delta M_{1,z,ideal}$$

Therefore, without additional information (e.g., it is known that $v_x(r)$ and $v_y(r)$ are negligible) the actual velocity cannot be recovered from the data.

For a typical phase contrast experiment with velocity encoding along the three orthogonal gradient coil axes x, y and z (N=3) the encoding matrix reduces to a (3×3) diagonal matrix.

$$\Omega = \begin{pmatrix} \Delta M_{1,x,ideal}^{(1)} & 0 & 0 \\ 0 & \Delta M_{1,y,ideal}^{(2)} & 0 \\ 0 & 0 & \Delta M_{1,z,ideal}^{(3)} \end{pmatrix} \quad (A4)$$

For identical velocity sensitivities $\Delta M = \Delta M_{1,x,ideal}^{(1)} = \Delta M_{1,y,ideal}^{(2)} = \Delta M_{1,z,ideal}^{(3)}$ along all encoding axes the measured phase differences are given by $\Delta\Phi(r) = \gamma\Delta M[\Lambda(r)]^T v(r)$ and the calculation of the true velocities (equation (7)) can be simplified to $$v(r) = \frac{1}{\gamma\Delta M}[\Lambda(r)]^{-T}\Delta\Phi(r). \quad (A5)$$

The invention claimed is:

1. A method for measuring velocities in phase contrast magnetic resonance imaging in the presence of magnetic field gradient field inhomogeneities comprising the steps of:
   a) encoding velocity information in at least three different encoding directions and measuring phase differences ($\Delta\Phi(r)$) in each direction,
   b) deriving actual first moments along the encoding directions using a magnetic field deviation matrix ($\Lambda(r)$),
   c) providing an (N×3) encoding matrix, $\Omega$, where N is the number of encoding directions, based on the ideal first moments along the N directions, and
   d) computing true velocities as a function of the gyromagnetic ratio, $\gamma$, magnetic field deviation matrix ($\Lambda(r)$), encoding matrix, $\Omega$, and a phase difference vector ($\Delta\Phi(r)$).

2. The method as defined by claim 1 wherein true velocity, v(r), is computed as follows:

$$v(r) = \frac{1}{\gamma}[\Lambda(r)\Omega]^{-T}\Delta\Phi(r).$$

3. The method as defined by claim 2 wherein the magnetic field gradients are produced using gradient coils, and the magnetic field deviation matrix is given by $$\Lambda(r) = \begin{pmatrix} \Lambda_{xx}(r) & \Lambda_{xy}(r) & \Lambda_{xz}(r) \\ \Lambda_{yx}(r) & \Lambda_{yy}(r) & \Lambda_{yz}(r) \\ \Lambda_{zx}(r) & \Lambda_{zy}(r) & \Lambda_{zy}(r) \end{pmatrix}$$

where the lambda terms are the deviations of the magnetic field produced by each gradient coil from the corresponding ideal gradient.

4. The method as defined by claim 2 wherein the encoding matrix, $\Omega$, is given by:

$$\Omega = (\Delta M_{1,ideal}^{(1)}, \Delta M_{1,ideal}^{(2)}, \ldots, \Delta M_{1,ideal}^{(N)}).$$

5. The method as defined by claim 4 wherein velocity sensitivities $\Delta M$ are identical along all encoding directions and the true velocity is given by:

$$v(r) = \frac{1}{\gamma \Delta M} [\Lambda(r)]^{-T} \Delta\Phi(r).$$

6. A method for computing velocities ($v_\perp(r)$) in phase contrast magnetic resonance imaging in the presence of magnetic gradient field inhomogeneities comprising the steps of:
 a) measuring velocity information including phase difference $\Delta\phi_1(r)$ along an encoding direction and the absolute gradient deviation $\|\Lambda(r)n\|$ in that direction, b) calculating flow encoding strength, $$\Delta M_{1,ideal}^{(1)} \sqrt{\sum_{j=1}^{3} \left[\sum_{i=1}^{3} n_i \Lambda_{ji}(r)\right]^2}$$

based on relative magnetic field gradient deviations and first moment difference, $\Delta M_{1,ideal}^{(1)}$, and
 c) computing the velocity using gyromagnetic ratio, $\gamma$, as:

$$v_\perp(r) = \frac{\Delta\phi_1(r)}{\gamma \Delta M_{1,ideal} \sqrt{\sum_{j=1}^{3} \left[\sum_{i=1}^{3} n_i \Lambda_{ji}(r)\right]^2}}.$$

* * * * *